US009668383B2

(12) United States Patent
Cox et al.

(10) Patent No.: US 9,668,383 B2
(45) Date of Patent: May 30, 2017

(54) SYSTEM FOR MOUNTING AND COOLING A COMPUTER COMPONENT (71) Applicant: INTERNATIONAL BUSINESS MACHINES CORPORATION, Armonk, NY (US)

(72) Inventors: Aaron R. Cox, Tucson, AZ (US); William J. Grady, IV, Cary, NC (US); Michael S. Miller, Raleigh, NC (US); Jason E. Minyard, Phoenix, AZ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/042,277

(22) Filed: Feb. 12, 2016

(65) Prior Publication Data

US 2016/0165761 A1 Jun. 9, 2016

Related U.S. Application Data (63) Continuation of application No. 13/774,766, filed on Feb. 22, 2013, now Pat. No. 9,292,057.

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |
| *G06F 1/20* | (2006.01) |
| *G06F 1/18* | (2006.01) |
| *H05K 7/14* | (2006.01) |

(52) U.S. Cl.
CPC ......... *H05K 7/20781* (2013.01); *G06F 1/182* (2013.01); *G06F 1/20* (2013.01); *H05K 7/1489* (2013.01); *G06F 2200/201* (2013.01)

(58) Field of Classification Search
CPC .................................. G06F 1/20; G06F 1/206
USPC ................... 361/679.53, 724, 725, 726, 727; 165/104.33; 62/259.2
See application file for complete search history.

(56) References Cited

U.S. PATENT DOCUMENTS

| | | | | |
|---|---|---|---|---|
| 7,408,775 B2* | 8/2008 | Walz | ................. | H05K 7/20645 165/104.33 |
| 2004/0221604 A1* | 11/2004 | Ota | .................... | H05K 7/20781 62/259.2 |

\* cited by examiner

Primary Examiner — Anthony Haughton
(74) Attorney, Agent, or Firm — Griffiths & Seaton PLLC (57) ABSTRACT A system includes a support rack and a component housing. The support rack includes a pair of vertically-extending panels, and each panel of the pair of vertically-extending panels has one or more first mating members of a water coupler pair extending outwardly from the support rack. The component housing is slidably disposed between the pair of vertically-extending panels and has a front panel, a pair of sidewalls extending rearwardly from the front panel, a component water line, and two second mating members of the water coupler pair connected to each other by the component water line.

16 Claims, 9 Drawing Sheets

SYSTEM FOR MOUNTING AND COOLING A COMPUTER COMPONENT

CROSS REFERENCE TO RELATED APPLICATIONS

This Application is a Continuation of U.S. patent application Ser. No. 13/774,766, filed on Feb. 22, 2013.

BACKGROUND OF THE INVENTION

Field of the Invention

The present invention relates in general to mounting computer components, and more particularly, to systems for mounting computer components that are capable of providing cooling thereto.

Description of the Related Art

In many large server applications, processors along with their associated electronics (e.g., memory, disk drives, power supplies, etc.) are packaged in removable node configurations. The nodes are stacked within an electronics (or IT) rack or frame and can be stored in drawers in the rack or frame. Alternatively, the electronics are coupled to the rack or frame at fixed locations. The IT racks or frames are typically disposed together and, at times, side-by-side in a single room.

To cool the components, the rooms may be equipped with air moving devices, such as fans or blowers, which move air in parallel airflow paths, usually front-to-back. In other cases in which components are included as parts of large installations, such as with "server farms" or large banks of computer racks that are located close together, liquid cooling (e.g., water cooling) is used to manage the higher heat fluxes. For example, water lines are coupled directly to a component and the liquid absorbs the heat dissipated by the components/modules in an efficient manner. Typically, the heat is ultimately transferred from the liquid to an outside environment, whether air or other liquid coolant.

SUMMARY OF THE INVENTION

Although liquid cooling is generally very effective for cooling components, it may be improved. For example, current liquid cooling systems run water lines directly to connectors located on computer components. The connectors are typically located at a rear portion of the components and may be difficult to access. Additionally, the water lines are relatively stiff, difficult to handle, and need to be manually disconnected, and hence, service and maintenance of the computer components may be time-consuming and challenging. Moreover, when the water lines are disconnected, liquid may be prone to drip onto the components.

To alleviate the aforementioned issues, improved systems for cooling components are now provided. In an embodiment, by way of example only, the computer component mounting system comprises a support rack including a pair of vertically-extending panels, and each panel of the pair of vertically-extending panels including one or more first mating members of a water coupler pair extending outwardly from the support rack; a component housing slidably disposed between the pair of vertically-extending panels and having a front panel, a pair of sidewalls extending rearwardly from the front panel, a component water line, and two second mating members of the water coupler pair connected to each other by the component water line, the front panel having a front surface including a first side portion and a second side portion extending beyond each sidewall of the pair of sidewalls, a first of the two second mating members of the water coupler pair disposed behind the first side portion and coupled to the first end section of the component water line, and a second of the two second mating members of the water coupler pair disposed behind the second side portion and coupled to the second end section, wherein the first and the second of the two second mating members are configured to engage with corresponding first mating members of the water coupler pair disposed on the vertically-extending panels of the support rack; wherein each of the second mating members of the water coupler pair includes a spring-loaded collar and a channel, the channel of the second mating member configured to engage with a corresponding portion of the first mating member of the water coupler pair when the spring-loaded collar is in a first position and to disengage from the corresponding portion when the spring-loaded collar is in a second position; and a latch coupled to one of the second mating members of the water coupler pair, the latch including a trigger configured to move the spring-loaded collar from the first position to the second position when force is applied to the trigger; wherein the latch further includes a connection mechanism in contact with the spring-loaded collar, and the connection mechanism is coupled to the trigger.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

The illustrated embodiments below provide a system that integrates automatic docking couplers adjacent to an Electronic Industries Alliance (EIA) ear space at the front of a server rack to thereby provide fixed, mating water line couplers in the front of the server rack. The system also includes improved component housings with an extended front panel including side portions that have cutout openings providing access to additional water line couplers that correspond to and mate with the water line couplers on the server rack. Each water line coupler on the component housing is biased to form a leak-tight seal with the water line coupler on the server rack, but can be mechanically released via a latch that can be manipulated to actuate coupler release. In this way, the component housing unlocks from the EIA rack, thereby being easily slid out of the server rack for service.

Figure 1:
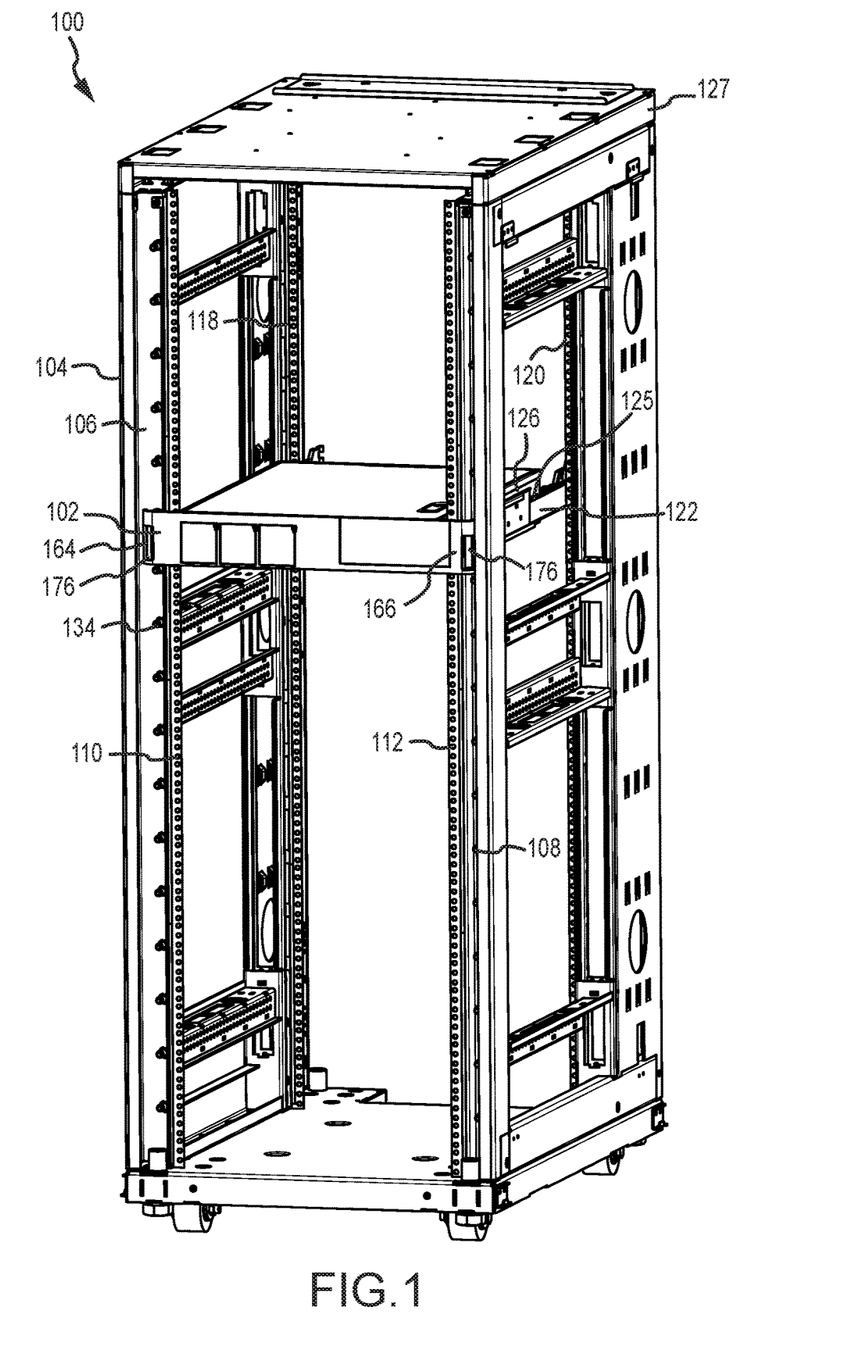
FIG. 1 is a perspective view illustration of a system for cooling computer components.

FIG. 1 is a perspective view illustration of a system 100 for cooling computer components, according to an embodiment. The system 100 includes a computing component 102 and a support rack 104. The computing component 102 is a server, in an embodiment. In other embodiments, the computing component 102 is another hardware component typically employed as part of a computer system and that may need to be cooled during operation.

The support rack 104 is configured for mounting the computing component 102 thereto. With additional reference to FIGS. 2 and 3, the support rack 104 is generally made up of a front pair of vertically-extending panels 106 and 108, a front pair of ear rails 110 and 112, a rear pair of vertical supports 114 and 116, a rear pair of ear rails 118 and 120, and horizontal slide and support rails 122 and 123. The front pair of ear rails 110 and 112 is disposed between the panels 106 and 108, and each extends alongside a corresponding one of the front pair of vertically-extending panels 106 and 108. Similarly, each ear rail of the rear pair of ear rails 118 and 120 extends alongside a corresponding one of the rear vertical supports 114 and 116, and is disposed between the supports 114 and 116.

Figure 2:
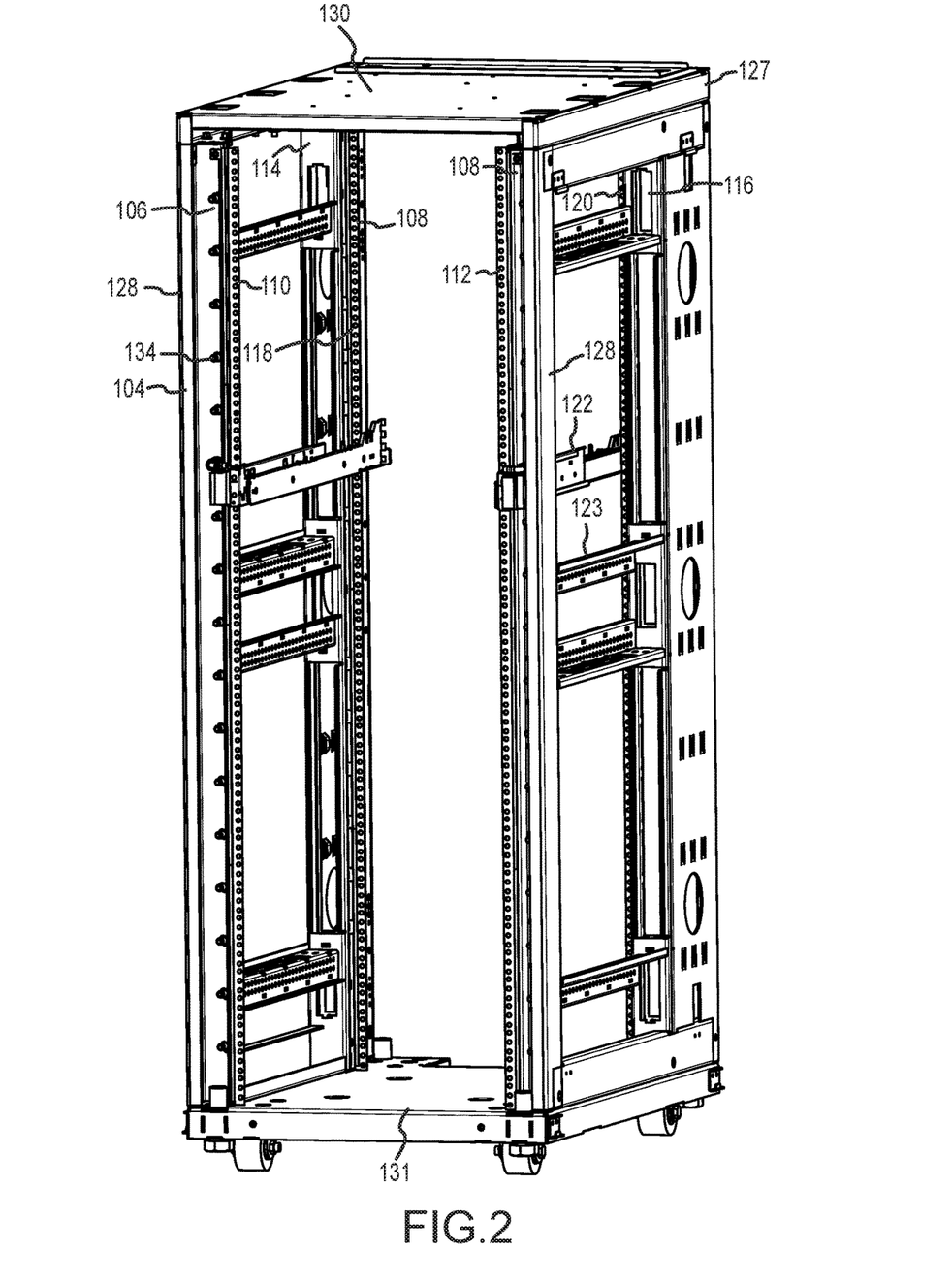
FIG. 2 is a perspective view illustration of a support rack that may be included in the system depicted in FIG. 1.
Figure 3:
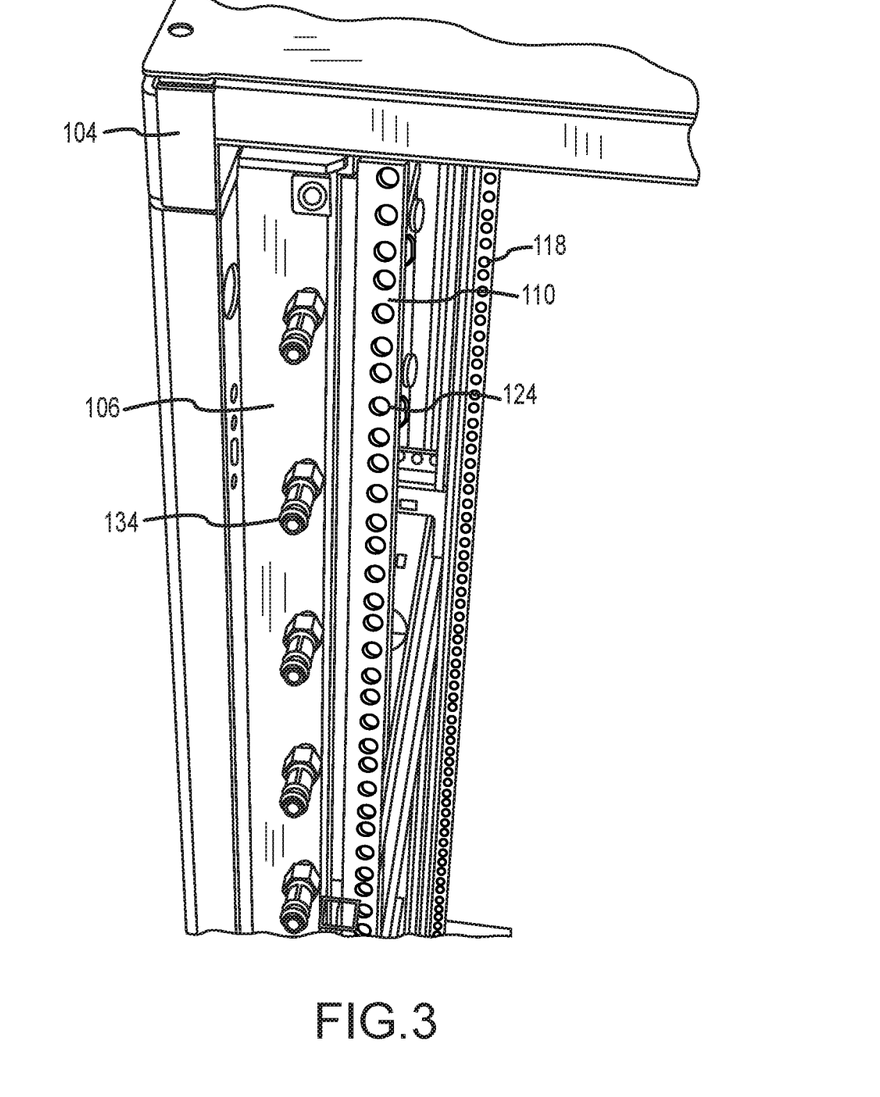
FIG. 3 is a close-up view illustration of a portion of the support rack depicted in FIG. 2.

Each ear rail 110, 112, 118, and 120 includes an array of openings 124 that can be optionally used for securing components to the support rack 104. Desirably, the front pair of ear rails 110 and 112, and likewise, the rear pair of ear rails 118 and 120, are located a predetermined distance from each other so that corresponding openings 124 on each ear rail of the front pair of ear rails 110 and 112 comply with configuration standards set forth by the EIA. For example, the front ear rails 110 and 112 are set a distance apart so that corresponding openings 124 are about 17.7-inches apart. The openings 124 on the rear pair of ear rails 118 and 120 are desirably located a predetermined apart as well.

The horizontal slide rails 122 extend between the front ear rails 110 and 112 and the rear vertical supports 114 and 116. The horizontal slide rails 122 are configured to correspond to rails 125 attached to side surfaces 126 of the component 102 and, in an embodiment, include roller bearings (not shown). In this way, the horizontal slide rails 122 to allow the corresponding rails 125 to be slid relative to each other so that the components 102 can be easily inserted into and removed from the support rack 104. The horizontal support rails 123 include hollow channels (not shown) formed therein for bundling cables, wires, or other connectors that run to and from the components 102 mounted to the support rack 104.

The support rack 104 is a standalone structure, in an embodiment. Alternatively, the support rack 104 is disposed within a cabinet frame 127 including outer vertical posts 128 each extending adjacent to and outside of the front pair of the vertically-extending panels 106 and 108 and rear vertical supports 114, and 116. The cabinet frame 127 includes a top wall 130 and a bottom platform 131 between which the outer vertical posts 128 extend. In an embodiment, the cabinet frame 127 has a door (not shown) for concealing the component 102 and other components within the cabinet frame 127.

As mentioned briefly above, the support rack 104 is configured to be used in a cooling system 100. In this regard, the front pair of vertically-extending panels 106 and 108 includes one or more first mating members 134 of a pair of water coupling mechanisms, which are configured to mate with corresponding second mating members 136 (FIG. 4) of the water coupler pair coupled to the component 102. In an embodiment, the first mating members 134 are spaced apart evenly along the lengths of the vertically-extending panels 106 and 108. For example, the first mating members 134 are disposed at predetermined U-space intervals along panels 106 and 108.

In an embodiment, the first mating members 134 are male couplers and extend frontward from the corresponding vertically-extending panel 106 or 108. As depicted in FIG. 3, a rear portion of the first mating member 134 is obstructed from view, when viewed from the front. An auxiliary water line (not shown) extends from a rear side of the panel 106 or 108 toward a common manifold (not shown) at a bottom of the support rack 104. In an embodiment, water lines running to panel 106 are configured to deliver cold liquid toward the component 102, and water lines running from panel 108 are configured to direct warm or hot liquid away from the component 102, or vice versa.

Figure 4:
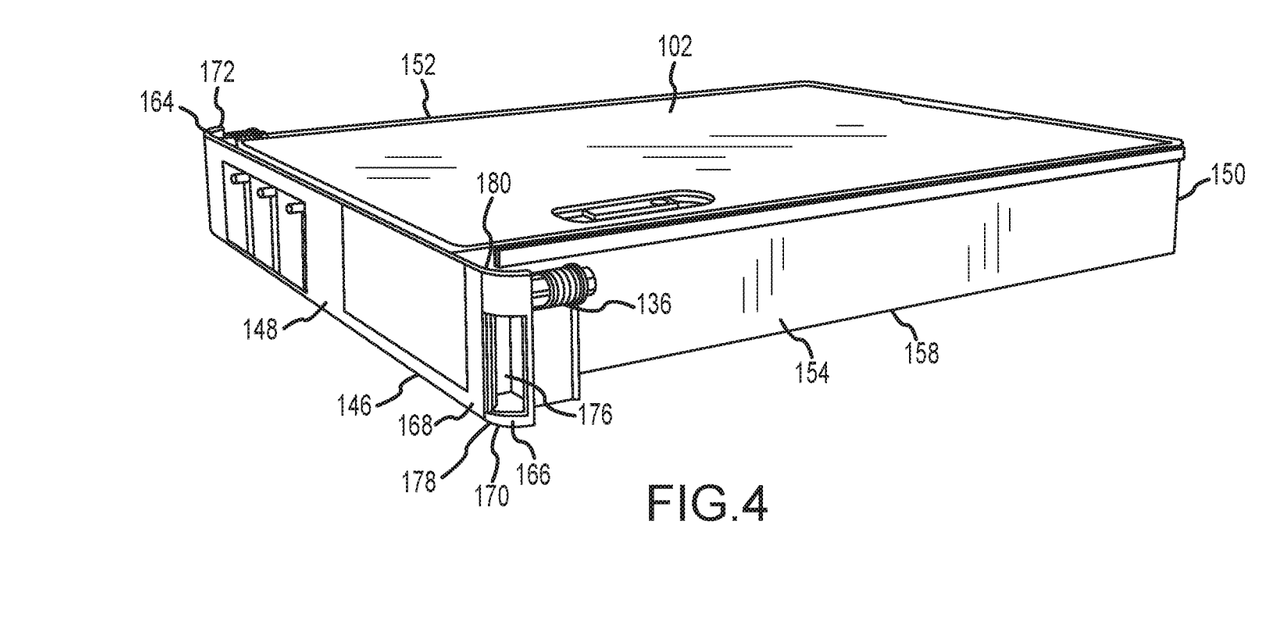
FIG. 4 is a perspective view illustration of a component housing that may be included in the system depicted in FIG. 1.
Figure 5:
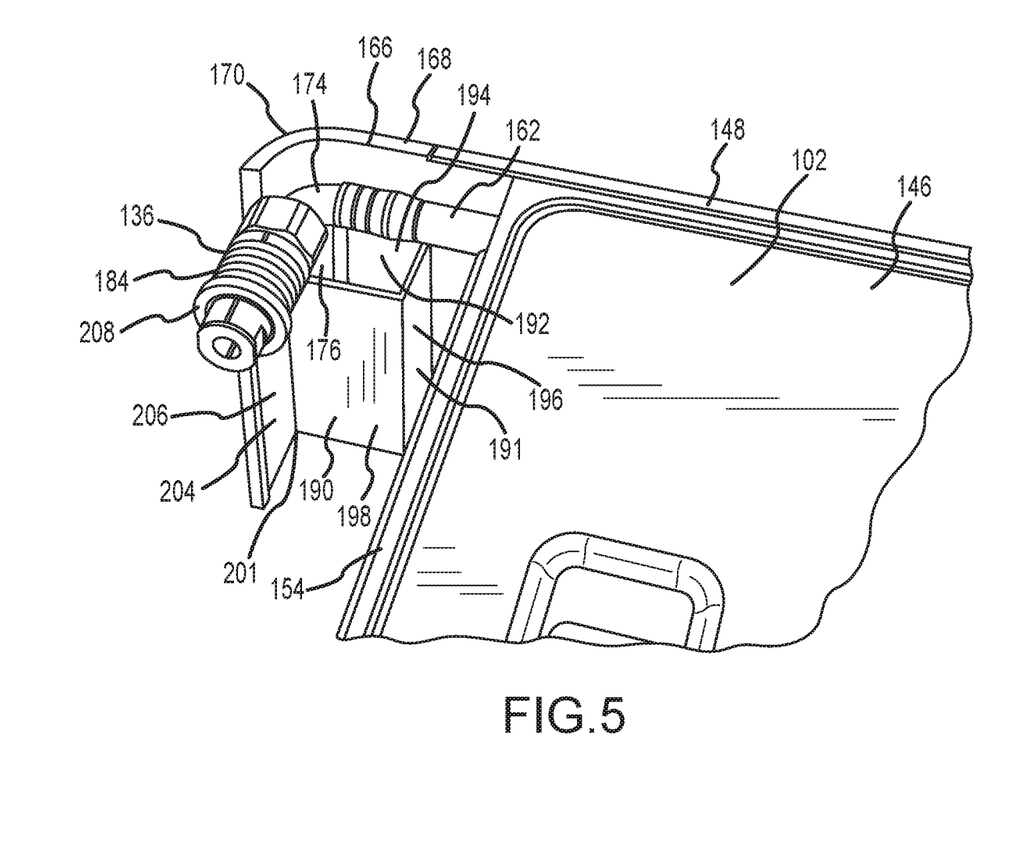
FIG. 5 is a close-up view illustration of a side portion of the component housing depicted in FIG. 4.

Turning now to FIGS. 1, 4, and 5, the server component 102 includes a component housing 146 that can be slidably disposed between the first pair of vertically-extending panels 106 and 108. The component housing 146 is generally a rectangular box and includes a front panel 148, a rear panel 150, a pair of sidewalls 152 and 154 extending rearwardly from the front panel 148 to the rear panel 150, and top and bottom panels 156 and 158. The panels 148, 150, 156, and 158 and the sidewalls 152 and 154 together define an interior cavity within which electronic parts, such as processors or other circuitry and small hardware components, are disposed. In addition to the electronics, in an embodiment, a component water line 162 (only the ends 172 and 174 of which is shown) is included in the interior cavity for cooling the electronic components during component 102 use.

The front panel 148 includes side portions 164 and 166, and each extends beyond the pair of sidewalls 152 and 154. The first and second side portions 164 and 166 each have a planar section 168 and a corner section 170. The planar sections 168 allow the ends 172 and 174 of the component water line 162 extending substantially parallel thereto to be obscured from view. Additionally, when the component housing 146 is disposed on the rack 104, each planar section 168 extends a sufficient length outside the side walls 152 and 154 past a corresponding one of the front ear rails 110 and 112. The corner section 170 is curved, in an embodiment, and includes a cutout 176 to provide access to the area behind the planar section 168. In this regard, the cutout 176 is formed below a portion of the corner section 170 for obscuring view of the end section 172 or 174 of the component water line 162 and is just above a bottom edge 178 of the front panel 148. In another embodiment, the corner section 170 is beveled, and/or the cutout 176 is located closer to a top edge 180 of the front panel 148 than the bottom edge 178.

As noted briefly above, the component water line 162 extends through the component housing 146 to cool the components therein. To connect the component water line 162 to one of the auxiliary water lines, second mating members 136 of the water coupler pair are included on each of the end section 172 or 174 of the component water line 162. Each second mating member 136 extends from a corresponding end section 172 or 174 toward a rear of the component housing 146. Additionally, a distance between the second mating members 136 matches a distance between the first mating members 134 of the water coupler pair so that when the component 102 is to be mounted to the support rack 102, the second mating member 136 can be easily aligned with and inserted into the first mating member 134 on the support rack 104. In an embodiment, the connection between the first and second mating members 136 mounts the component 102 to the support rack 104.

Figure 6:
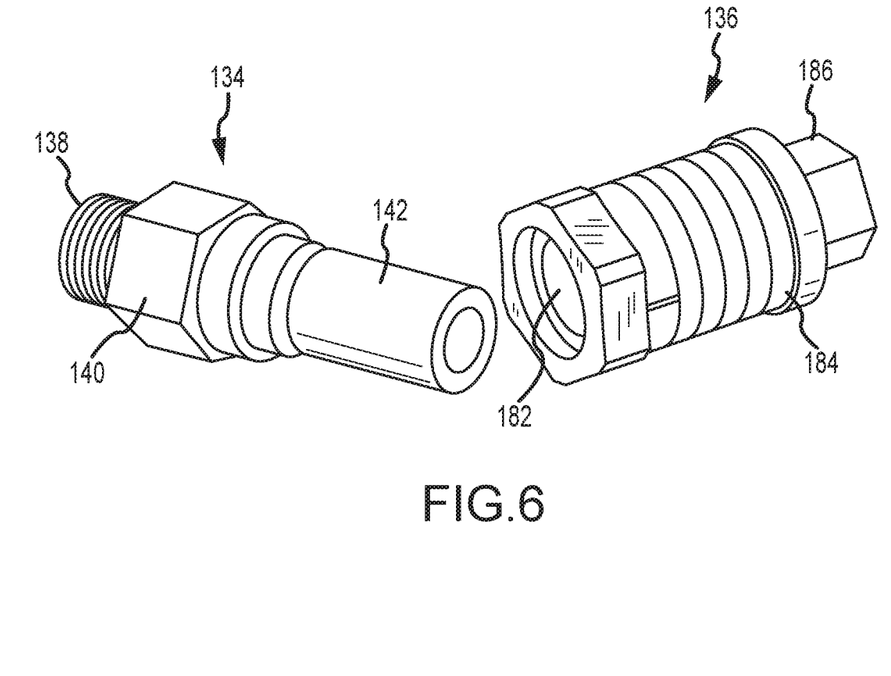
FIG. 6 is a perspective view of a water coupler pair that may be included in the system depicted in FIG. 1.

With additional reference to FIG. 6, close-up views of the first mating member 134 and the second mating member 136 are provided. The first mating member 134 is generally cylindrical and includes a rear threaded portion 138, a coupling nut 140, and an insertion pin 142. The rear threaded portion 138 and insertion pin 142 are formed on opposite ends of the member 134 cylinder, and the adjustable coupling nut 140 is disposed on the cylinder therebetween. With additional reference to FIG. 3, as alluded to briefly above, the rear threaded portion 138 is configured to attach to an end of an auxiliary water line (not shown) having an opening defined by corresponding threaded walls. The coupling nut 140 is configured to be adjusted such that when the first mating member 134 is coupled to the auxiliary water line, the coupling nut 140 can be rotated in an appropriate direction to tighten the nut 140 against the panel 106 or 108 to thereby secure the first mating member 134 to the panel 106 or 108. Retuning to FIG. 6, the insertion pin 142 is configured to be inserted into and to form a leak-tight seal with the corresponding second mating member 136 of the water coupler pair on the component 102.

The second mating member 136 is a female water coupler and is generally cylindrical having a channel 182 for receiving the insertion pin 142 of the first mating member 134, a spring-loaded collar 184, and a connection nut 186. To form the leak-tight seal with the first mating member 134 when inserted in the channel 182, the channel 182 includes a rubber, plastic or other type of seal, in an embodiment. The spring-loaded collar 184 either surrounds a separate piece within which the channel 182 is formed or defines a portion of the channel 182. The spring-loaded collar 184 is configured to be biased in a first position to place the second mating member 136 in an elongated configuration. Thus, when the members 134 and 136 are mated, the elongated configuration of the second mating member 136 allows the two members 134 and 136 to sealingly connect together. The spring-loaded collar 184 can be slid into a second position placing the second mating member 136 in a contracted configuration, which causes the insertion pin 142 and the seal within the channel 182 to break the leak-tight seal therebetween and to be quickly disconnected from each other. The connection nut 186 has a threaded inner surface and is used to couple the second mating member 136 to a threaded outer surface of the end section 172 or 174 of the component water line 162.

Figure 7:
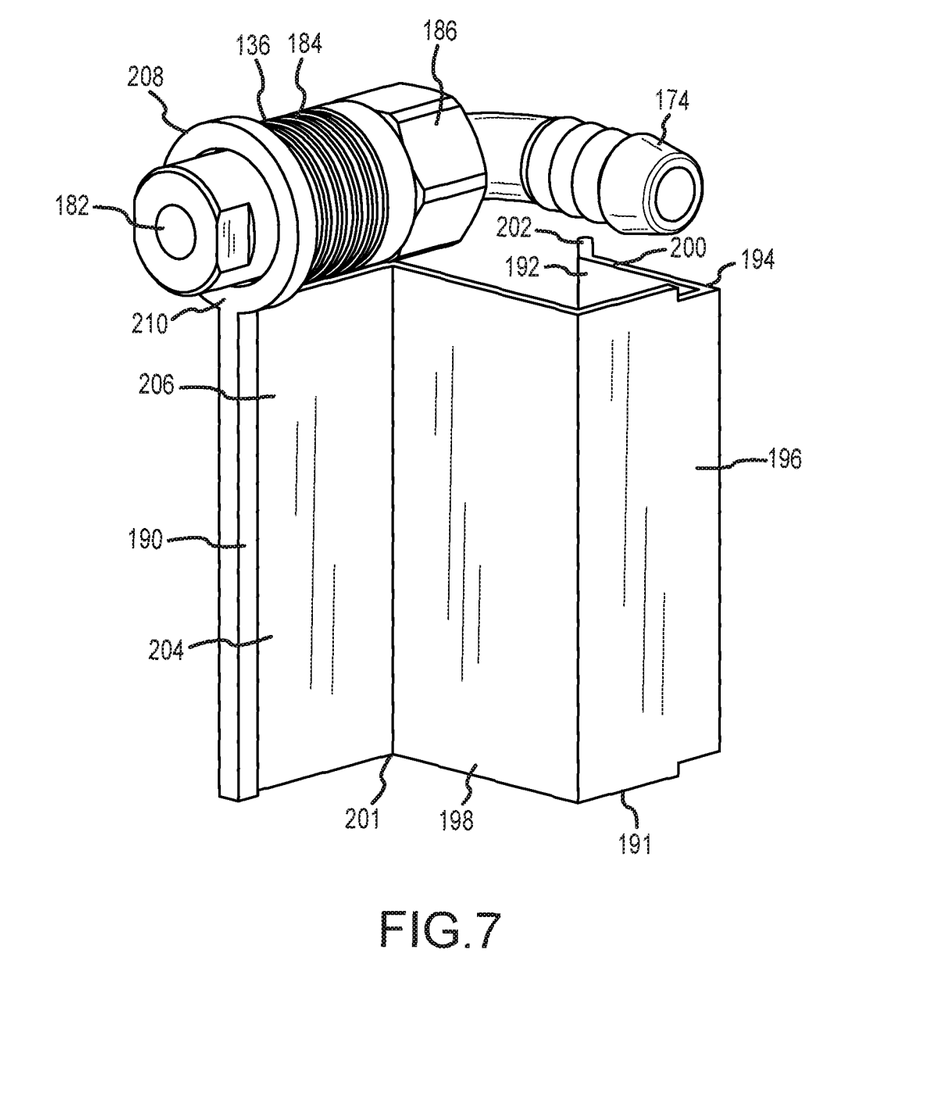
FIG. 7 is a perspective view illustration of a latch connected to a mating member of a water coupler pair that may be included on the component housing depicted in FIG. 4.
Figure 8:
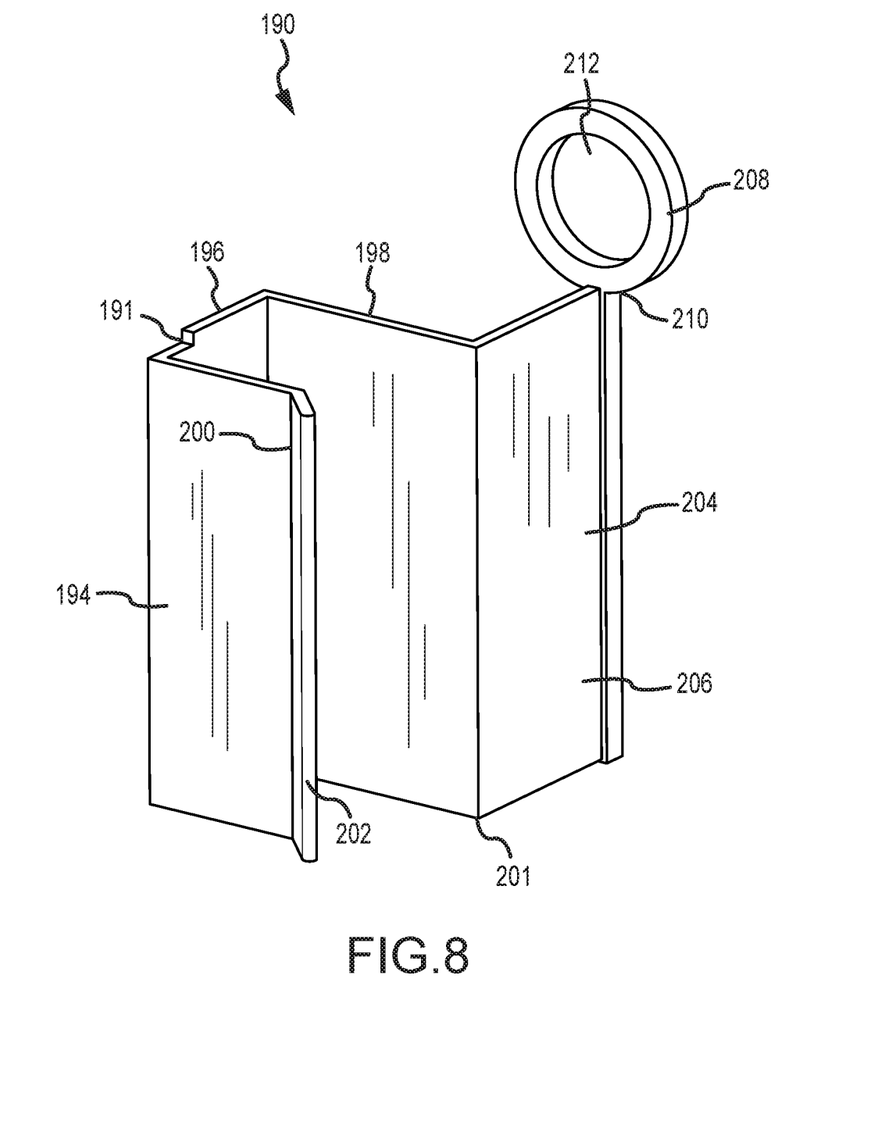
FIG. 8 is a perspective view illustration of the latch depicted in FIG. 7.

With reference to FIGS. 5, 7, and 8, to more easily manipulate the quick release feature of the water coupler pair, a latch 190 is coupled to the spring-loaded collar 184 and accessible by the user through the cutout 176 formed in the front panel 148 of the component housing 142. The latch 190 is configured to provide a surface 192 that can receive a force from one or more fingertips of the user and transmit the force to the collar 184 to thereby actuate the collar 184. For example, the latch 190 includes a C-shaped trigger portion 191 that includes an actuation plate 194, a first connector plate 196, and a second connector plate 198. The actuation plate 194 provides the surface 192 the user accesses and is generally configured to be substantially parallel to the front panel 148. In an embodiment, a height of the actuation plate 194 is less than a height of the front panel 148 and slightly greater than a height of the cutout 176. In an alternative embodiment, the actuation plate 194 has a height that is less than the height of the cutout 176. To prevent injury to the user, the edge 200 configured to be closest to the cutout 176 includes an angled flange portion 202 that consequently slants toward the front panel 148. The flange portion 202 extends along an entirety of the edge 200, in an embodiment. Alternatively, the flange portion 202 runs along a portion of the edge 200.

The first connector plate 196 extends from an edge of the actuation plate 194 and is angled relative to the actuation plate 194. In an embodiment, as depicted in the illustrations, the first connector plate 196 is formed substantially perpendicular to the actuation plate 194. In another embodiment, the first connector plate 196 is angled non-perpendicularly relative to the actuation plate 194, for example, extending less than 90 degrees from the actuation plate 194. The second connector plate 198 extends at an angle from an edge of the first plate 196. According to an embodiment, the second connector plate 198 extends such that it is substantially parallel to the actuation plate 194. In another embodiment, the second connector plate 198 is not parallel to the actuation plate 194, but extends in the same direction as the actuation plate 194. The second connector plate 198 is configured such that its edge 201, when the latch 190 is coupled to the second mating member 136, is located just under the second mating member 136.

An attachment portion 204 extends from the C-shaped trigger portion 191 to couple to the spring-loaded collar 184 of the second mating member 136. In an example, the attachment portion 204 includes a plate section 206 and a ring portion 208. The plate section 206 extends from the edge of the second connector plate 188 and aligns with a portion of the length of the second mating member 136. The ring portion 208 is formed at a corner 210 of the end of the plate section 206 to conveniently attach to the spring-loaded collar 184. For example, the ring portion 208 has an opening 212 that is slightly larger than a diameter of the spring-loaded collar 184 to slip thereover. In another embodiment, the portion 208 is adhered or otherwise attached to an end of the spring-loaded collar 184 and the opening 212 is sufficiently sized such to allow the first mating member 134 to be inserted therethrough.

The latch 190 is formed from a relatively stiff material, in an embodiment, such a metal, steel, or a hard plastic, that is capable of transmitting a force from the actuation plate 194 to the spring-loaded collar 184. Although the trigger portion 191 is depicted as including three distinct plates 194, 196, and 198, the trigger portion 191 is a single piece having a curved C-shape, in another embodiment. In still another embodiment, the trigger portion 191 includes an actuation ring in which a finger can be inserted and a spring or rod extending from the actuation ring for coupling with the second mating member 136.

Figure 9:
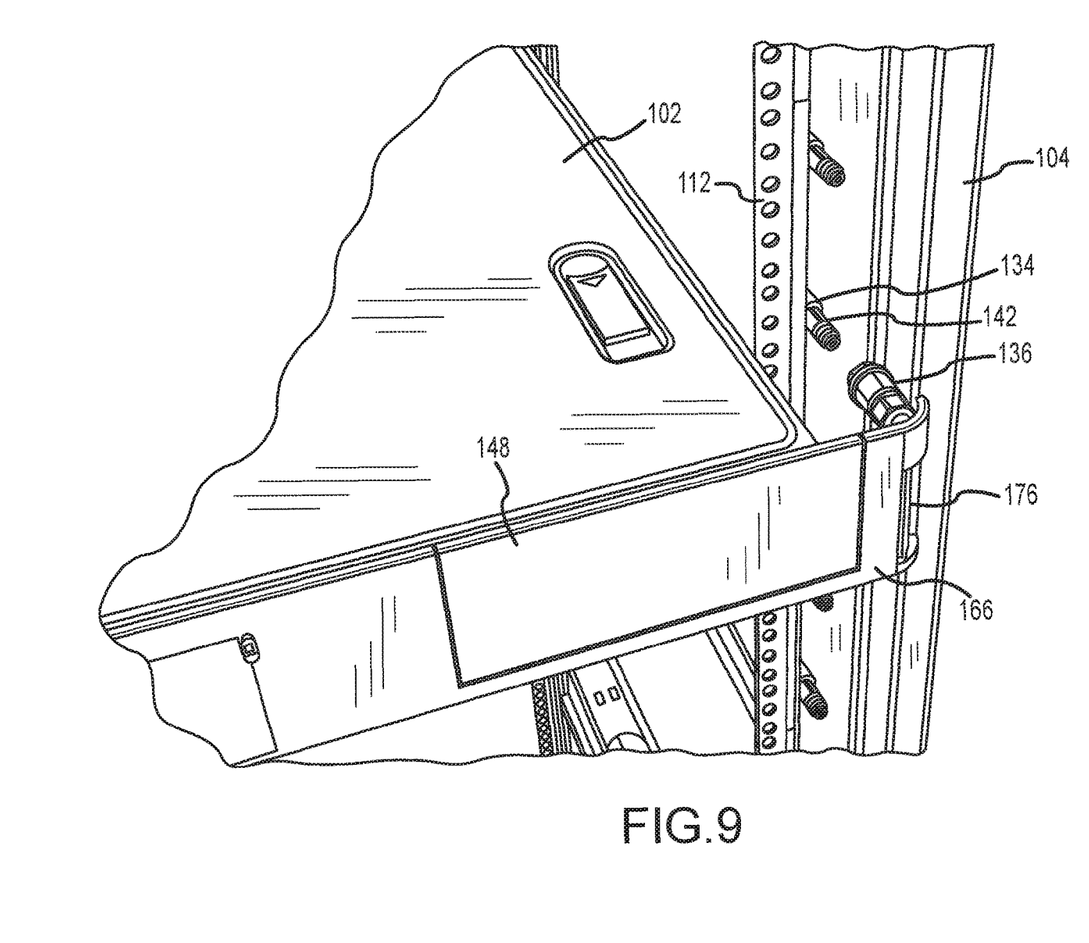
FIG. 9 is a perspective view illustration of a portion of a component housing disposed within and disconnected from a portion of the support rack.

Referring now to FIGS. 1 and 9, the computer component 102 is inserted between the front ear rails 110 and 112 and rails 125 on side walls 152 and 154 of the component 102 are matched with and placed into the desired horizontal slide rails 123 on the support rack 104. Once sufficiently disposed on the horizontal slide rails 123, the computer component 102 is pushed into the support rack 104 until the insertion pin 142 of the first mating member 134 and is disposed within the channel 182 of the second mating members 136. The user may need to exert additional force on the front panel 148 of the component 102 to cause the second mating member 136 to fully engage with the first mating member 134 and form the leak-tight seal therebetween to thereby create a water connection between the water coupler pair.

When service or maintenance is to be performed on the computer component 102, the user removes the computer component 102 by inserting one or more fingers through the cutout 176 of each side portion 164 and 166 and pulling on the trigger 191 of the latch 190 (see FIG. 5). For example, the user pulls the actuation plate 194 forward toward the front panel 148, which consequently causes the spring-loaded collar 184 to also move forward and release the first mating member 134 from the second mating member 136.

The above described system for cooling computer components mounted on a support rack is compact and, because no flexible water line bend space is required, occupies a small footprint relative to previous cooling systems. The inclusion of automatically-docking water couplers provides an easy and user fool-proof system for reconnecting water lines that run through computer components to water lines that are connected to manifolds external to the system. Sliding the computer component into a seated mounted position automatically mates the water coupler connections, while sliding the component out for service automatically disconnects the water coupler connections. Moreover, because the water connection is located at a position outside of the ear rails and radially exterior to the components, potential drips are isolated from sensitive electronic parts. Additionally, the latches allow for easy finger-tip actuation/release of the recessed water couplers, which are hidden behind the front panel of the component. The latch can be manipulated to cause the water couplers to lock and form the water connections. The mated water couplers can also be used to secure the computer component to the rack, thereby further simplifying usability.

Although at least one embodiment has been described above, it should be appreciated that such embodiments are only examples, and are not intended to limit the scope, applicability, or configuration of the invention in any way. A vast number of variations exist and it should be understood that various changes may be made in the function and arrangement of elements described in an exemplary embodiment without departing from the scope of the invention as set forth in the appended claims.

What is claimed is:

1. A computer component mounting system comprising:
   a support rack including a pair of vertically-extending panels, and each panel of the pair of vertically-extending panels including one or more first mating members of a water coupler pair extending outwardly from the support rack;
   a component housing slidably disposed between the pair of vertically-extending panels and having a front panel, a pair of sidewalls extending rearwardly from the front panel, a component water line, and two second mating members of the water coupler pair connected to each other by the component water line, the front panel having a front surface including a first side portion and a second side portion extending beyond each sidewall of the pair of sidewalls, a first of the two second mating members of the water coupler pair disposed behind the first side portion and coupled to the first end section of the component water line, and a second of the two second mating members of the water coupler pair disposed behind the second side portion and coupled to the second end section, wherein the first and the second of the two second mating members are configured to engage with corresponding first mating members of the water coupler pair disposed on the vertically-extending panels of the support rack; wherein each of the second mating members of the water coupler pair includes a spring-loaded collar and a channel, the channel of the second mating member configured to engage with a corresponding portion of the first mating member of the water coupler pair when the spring-loaded collar is in a first position and to disengage from the corresponding portion when the spring-loaded collar is in a second position; and
   a latch coupled to one of the second mating members of the water coupler pair, the latch including a trigger configured to move the spring-loaded collar from the first position to the second position when force is applied to the trigger; wherein the latch further includes a connection mechanism in contact with the spring-loaded collar, and the connection mechanism is coupled to the trigger.

2. The system of claim 1, wherein the connection mechanism is coupled to the spring-loaded collar.

3. The system of claim 1, wherein the trigger is C-shaped and includes an actuation plate plate configured to receive the force.

4. The system of claim 1, wherein each of the first and second side portions of the front panel includes a cutout providing access to the water coupler pair.

5. The system of claim 1, wherein the first and second side portions each include a curved corner, and the first and second end sections of the component water line are disposed behind the first and second side portions, respectively.

6. The system of claim 1, wherein each of the first and second side portions of the front panel includes a cutout providing access to the water coupler pair, and each cutout is formed at a location on the corner that substantially obscures viewing of the component water line and the water coupler pair.

7. The system of claim 1, wherein:
   the component housing includes an interior defined in part by the pair of side walls and the front panel,
   a plurality of electronic components is disposed in the interior of the component housing, and
   the component water line extends through the interior of the component housing to provide cooling to the plurality of electronic components.

8. The system of claim 1, wherein the support rack further comprises a pair of vertical supports spaced apart from the pair of vertically-extending panels, and one or more horizontally-extending rails extending between one support of the pair of vertically-extending panels and one panel of the pair of vertical supports.

9. The system of claim 1, wherein the support rack further comprises vertical ear rails each disposed inside and alongside the pair of vertically-extending panels, each of the vertical ear rails include a plurality of fastener openings for mounting computer components thereto.

10. The system of claim 9, wherein the first and second side portions of the front panel extends over corresponding vertical ear rails of the support rack.

11. The system of claim 9, wherein each panel of the pair of vertically-extending panels is recessed relative to a corresponding adjacent vertical ear rail.

12. The system of claim 1, wherein each panel of the pair of vertically-extending panels includes a plurality of first mating members of the water coupler pairs spaced along a length of the panel.

13. The system of claim 1, further comprising an outer frame within which the support rack is disposed.

14. The system of claim 13, wherein the outer frame includes vertical posts extending outside of the support rack.

15. A support rack for mounting a computer component comprising:
   a pair of vertically-extending panels, each panel of the pair of vertically-extending panels including one or more first mating members of a water coupler pair extending outwardly from the support rack configured to sealingly engage with corresponding second mating members of the water coupler pair coupled to the computer component; wherein each of the second mating members of the water coupler pair includes a spring-loaded collar and a channel, the channel of the second mating member configured to engage with a corresponding portion of the first mating member of the water coupler pair when the spring-loaded collar is in a first position and to disengage from the corresponding portion when the spring-loaded collar is in a second position; and
   a latch coupled to one of the second mating members of the water coupler pair, the latch including a trigger configured to move the spring-loaded collar from the first position to the second position when force is applied to the trigger; wherein the latch further includes a connection mechanism in contact with the spring-loaded collar, and the connection mechanism is coupled to the trigger.

16. A computer component for mounting to a support rack comprising:
   a front panel including a first side portion and a second side portion;
   a pair of sidewalls extending rearwardly from the front panel defining an interior with the front panel;
   a component water line disposed, in part, in the interior and includes a first end and a second end section extending outside of the interior;
   two first mating members of a water coupler pair connected to each other by the component water line, respectively,
   wherein:
      a first of the two first mating members of the water coupler pair is disposed behind the first side portion and coupled to the first end section of the component water line,
      a second of the two second mating members of the water coupler pair is disposed behind the second side portion and coupled to the second end section, and the first and the second of the two second mating members are configured to engage with corresponding second mating members of the water coupler pair disposed on the support rack; wherein each of the second mating members of the water coupler pair includes a spring-loaded collar and a channel, the channel of the second mating member configured to engage with a corresponding portion of the first mating member of the water coupler pair when the spring-loaded collar is in a first position and to disengage from the corresponding portion when the spring-loaded collar is in a second position; and
   a latch coupled to one of the second mating members of the water coupler pair, the latch including a trigger configured to move the spring-loaded collar from the first position to the second position when force is applied to the trigger; wherein the latch further includes a connection mechanism in contact with the spring-loaded collar, and the connection mechanism is coupled to the trigger.

* * * * *